United States Patent
Lafuente et al.

(10) Patent No.: US 9,948,449 B2
(45) Date of Patent: *Apr. 17, 2018

(54) TRIM FOR DUAL-PORT FREQUENCY MODULATION

(71) Applicant: SUNRISE MICRO DEVICES, INC., Deerfield Beach, FL (US)

(72) Inventors: Mario Lafuente, Miami, FL (US); Paul Edward Gorday, West Palm Beach, FL (US)

(73) Assignee: SUNRISE MICRO DEVICES, INC., Deerfield Beach, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 15/493,229

(22) Filed: Apr. 21, 2017

(65) Prior Publication Data

US 2017/0222794 A1 Aug. 3, 2017

Related U.S. Application Data

(63) Continuation of application No. 15/007,969, filed on Jan. 27, 2016, now Pat. No. 9,634,877.

(60) Provisional application No. 62/187,667, filed on Jul. 1, 2015.

(51) Int. Cl.
*H04L 7/033* (2006.01)
*H04L 27/12* (2006.01)

(52) U.S. Cl.
CPC .............. *H04L 7/033* (2013.01); *H04L 27/12* (2013.01)

(58) Field of Classification Search
CPC ..... H04L 27/3411; H04L 7/0331; H04L 43/50
See application file for complete search history.

(56) References Cited

U.S. PATENT DOCUMENTS

| | | | |
|---|---|---|---|
| 6,933,798 B2* | 8/2005 | Hammes ............... | H03C 3/0925 331/16 |
| 7,430,265 B2* | 9/2008 | Convent .............. | H03C 3/0925 327/147 |
| 7,979,038 B2* | 7/2011 | Mitani ................. | H03C 3/0908 332/127 |
| 2004/0192231 A1* | 9/2004 | Grewing .............. | H03C 3/0925 455/102 |

OTHER PUBLICATIONS

Peng, K. C., et al. "Design of a CMOS VCO with two tuning inputs applied for a wideband GFSK-modulated frequency synthesizer." Radio and Wireless Symposium, 2006 IEEE. IEEE, 2006.
Peng, Kang-Chun, et al. "High-performance frequency-hopping transmitters using two-point delta-sigma modulation." Microwave Theory and Techniques, IEEE Transactions on 52.11 (2004): 2529-2535.
Yu, Rui, et al. "A 5.5 mA 2.4-GHz two-point modulation Zigbee transmitter with modulation gain calibration." Custom Integrated Circuits Conference, 2009. CICC'09. IEEE. IEEE, 2009.
Filiol, Norman M., et al. "An agile ISM band frequency synthesizer with built-in GMSK data modulation." Solid-State Circuits, IEEE Journal of 33.7 (1998): 998-1008.

* cited by examiner

*Primary Examiner* — Freshteh N Aghdam
(74) *Attorney, Agent, or Firm* — Leveque IP Law, P.C.

(57) ABSTRACT

Various methods provide for trimming the gain in a dual-port phase-locked loop (PLL) of a radio transceiver. Use is made of the radio's demodulator to perform modulation accuracy measurements, thereby reducing the cost and complexity of external test equipment.

16 Claims, 7 Drawing Sheets

TRIM FOR DUAL-PORT FREQUENCY MODULATION

PRIORITY CLAIM

This application is a continuation patent application that claims priority to U.S. patent application Ser. No. 15/007,969 filed on Jan. 27, 2016, which claims the benefit of Provisional Patent Application No. 62/187,667, filed Jul. 1, 2015, the contents of which are hereby incorporated by reference in their entirety.

BACKGROUND

In order to obtain a desired all-pass modulation characteristic of a phase-locked loop (PLL) of a radio transceiver, in which the transfer functions for two ports of the PLL are complementary, both ports are modulated simultaneously and the overall transfer function seen by the modulating signal will preferably have an all-pass characteristic. In order to achieve the desired all-pass characteristic, however, both PLL ports must have equal gains. While the digital gain is stable and accurate, the analog gain can vary with process and temperature and must be trimmed in the factory to equal that of the digital gain.

A factory test station, sometime referred to as a trim station, may include test equipment that can receive the modulated carrier signal and measure its modulation accuracy. The trim procedure would include transmitting a known modulation waveform from the radio transceiver, while varying the analog gain until desired modulation accuracy is achieved. The need for an external receiver adds to the cost and complexity of the trim station.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
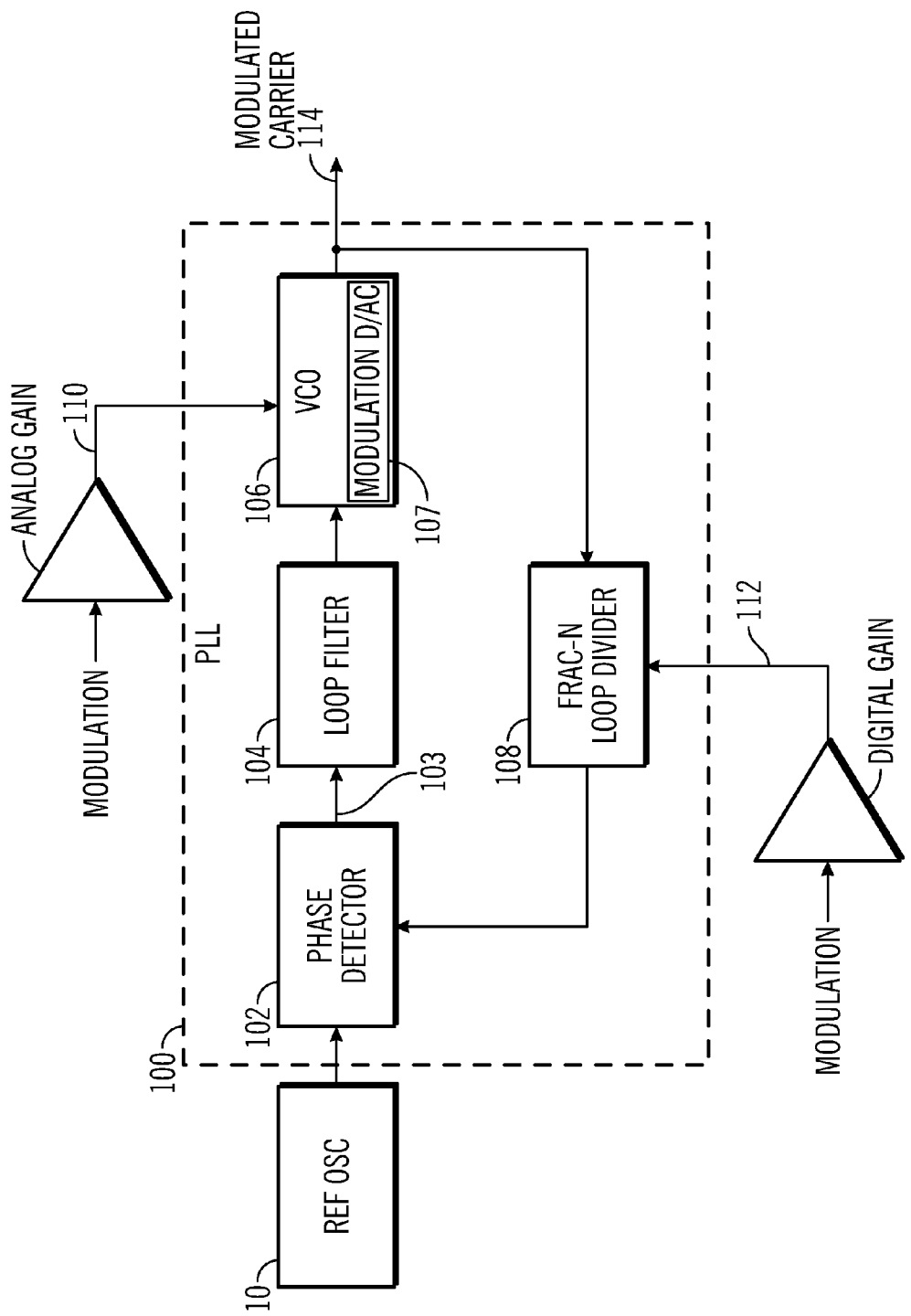
FIG. 1 is a block diagram 100 that illustrates dual-port frequency modulation, in accordance with various representative embodiments.

The various apparatus and devices described herein provide for trimming the gain in a dual-port phase-locked loop (PLL) of a radio transceiver. Use is made of the radio's demodulator to perform modulation accuracy measurements, thereby reducing the cost and complexity of external test equipment often associated with trim stations.

In accordance with certain representative embodiments of the present disclosure, there is provided a method for trimming analog gain of a transceiver of a radio: modulating a signal generated by a phase-locked loop of the transceiver to generate a modulated signal; generating by the transceiver a modulated intermediate frequency signal from an RF signal and the modulated signal; processing the modulated intermediate frequency signal by a demodulator of the transceiver to determine modulation accuracy of the modulated intermediate frequency signal; and monitoring the determined modulation accuracy of the modulated intermediate frequency signal and responsive to the determined modulation accuracy falling outside an acceptable range of modulation accuracy, adjusting the analog gain value of the transceiver to bring the modulation accuracy of the modulated intermediate frequency signal within the acceptable range of modulation accuracy.

While this disclosure is susceptible of embodiment in many different forms, there is shown in the drawings and will herein be described in detail specific embodiments, with the understanding that the present disclosure is to be considered as an example of the principles of the invention and not intended to limit the disclosure to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

Referring now to FIG. 1, a dual-port frequency modulation block diagram 100 is shown. Dual-port frequency modulation is a technique in which the modulation waveform is simultaneously applied to two points (ports) in a phase-locked loop (PLL). Phase detector 102 of PLL 100 is supplied a reference from oscillator 10 and compares this reference with the input signal provided by loop divider 108 and produces an error signal 103 that is proportional to the phase difference between these two input signals. Error signal 103 is then filtered by loop filter 104, or other low-pass filter, and the filtered error signal is used to drive voltage-controlled oscillator (VCO) 106, which in turn generates a modulated carrier signal 114 as shown. A negative feedback loop from the output of VCO 106 back to phase detector 102 is provided by loop divider 108. As the output phase of modulated carrier 114 drifts, the error signal 103 produced by phase detector 102 increases and is used to drive the VCO's output phase in the opposite direction, thereby reducing error.

The transfer functions for the two ports 110 and 112 of the PLL are complementary, one is low-pass and the other is high-pass, and the corner frequency of each transfer function is determined by the PLL loop bandwidth. By modulating both PLL ports 110 and 112 simultaneously, the overall transfer function seen by the modulating signal has an all-pass characteristic. An advantage of this technique is that the PLL loop bandwidth can be selected independently from the data bandwidth, and a narrow PLL bandwidth can be selected for good phase noise performance while still allowing wide-bandwidth data modulation. In order to achieve the desired all-pass characteristic, however, both PLL ports must have equal gains. The digital gain is stable and accurate, but the analog gain can vary with process and temperature and must be trimmed in the factory.

The factory test station, sometime referred to as a trim station, may include external test equipment that can receive the modulated carrier signal 114 and measure its modulation accuracy. The trim procedure would include transmitting a known modulation waveform 114 from the device-under-test (DUT), the radio transceiver, while varying the analog gain at port 110 until desired modulation accuracy is achieved. The embodiments described herein are intended to remove the need for the external receiver, thereby reducing the cost and complexity of the factory test station.

Figure 2:
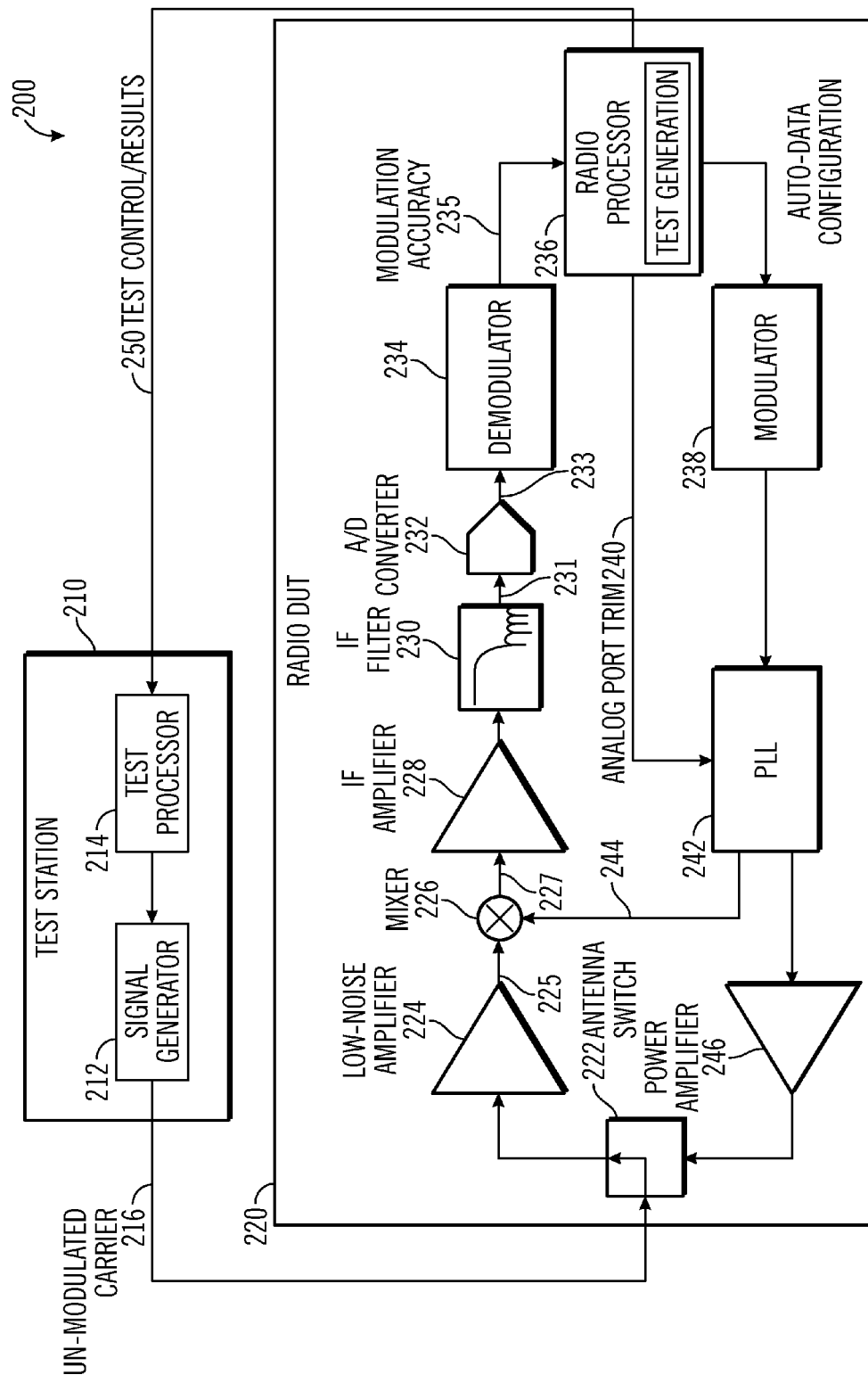
FIG. 2 is a block diagram of a trim test set-up for trimming the analog gain of a radio transceiver, in accordance with various representative embodiments.

Because the same PLL is used by the radio transceiver for both transmission and reception, an alternative trim procedure described herein is to frequency modulate the signal produced by the PLL of the transceiver while receiving an un-modulated carrier. Referring now to FIG. 2, block diagram 200 of a trim test set-up for trimming the analog gain of a radio transceiver, in accordance with example embodiments, is illustrated. Test station 210, unlike conventional test set-ups, does not have an external receiver. Rather, signal generator 212 of test station 210 generates un-modulated carrier 216 for receipt by radio transceiver 220, the DUT, and test processor 214 of test station 210 receives test results 250 from the transceiver processor 236. The radio's frequency modulation (FM) demodulator 234 has a modulation accuracy measurement feature, allowing modulation accuracy to be measured and monitored within the radio transceiver, rather than by test station 210. The radio transceiver's analog gain is adjusted by analog trim signal 244 generated by transceiver processor 236. More specifically, referring back to the PLL 100 of FIG. 1, the VCO's modulation digital-to-analog converter (DAC) 107 can be adjusted in various ways, as will be described in the examples that follow.

With this procedure, then, test station 210 requires only a basic signal generator 212, which is less expensive than a test receiver. In accordance with the embodiments contained herein, analog gain can therefore be trimmed with less expensive and less complex test stations.

Output signal 244 of PLL 242 is modulated by modulator 238 in accordance with a test data pattern provided to modulator 238 by transceiver processor 236. This modulation occurs while transceiver 220 receives un-modulated carrier 216 from test station signal generator 212. After passing through antenna switch 222 and low-noise amplifier 224, RF signal 225 is mixed with modulated signal 244 at mixer 226, which produces modulated analog signal 227 as shown; RF signal 225 is accordingly derived from un-modulated carrier 236. Modulated analog signal 227 is further processed to generate modulated intermediate frequency (IF) signal 233; signal 227 is amplified by IF amplifier 228 and then filtered by IF filter 230 to generate amplified, filtered analog signal 231, which is converted from analog to digital by analog-to-digital (A/D) converter 232 to produce modulated IF signal 233.

Demodulator 234 receives and processes modulated IF signal 233 to determine the modulation accuracy of modulated IF signal 233. Signal 235 produced by demodulator 234 is representative of the determined modulation accuracy to radio transceiver processor 236. Processor 236 monitors the determined modulation accuracy 235 of modulated IF signal 233 and, responsive to the determined modulation accuracy falling outside an acceptable range of modulation accuracy, adjusts the analog gain value of the transceiver, using analog port trim signal 240, to bring the modulation accuracy of the modulated intermediate frequency signal 233 within an acceptable range of modulation accuracy.

Figure 3:
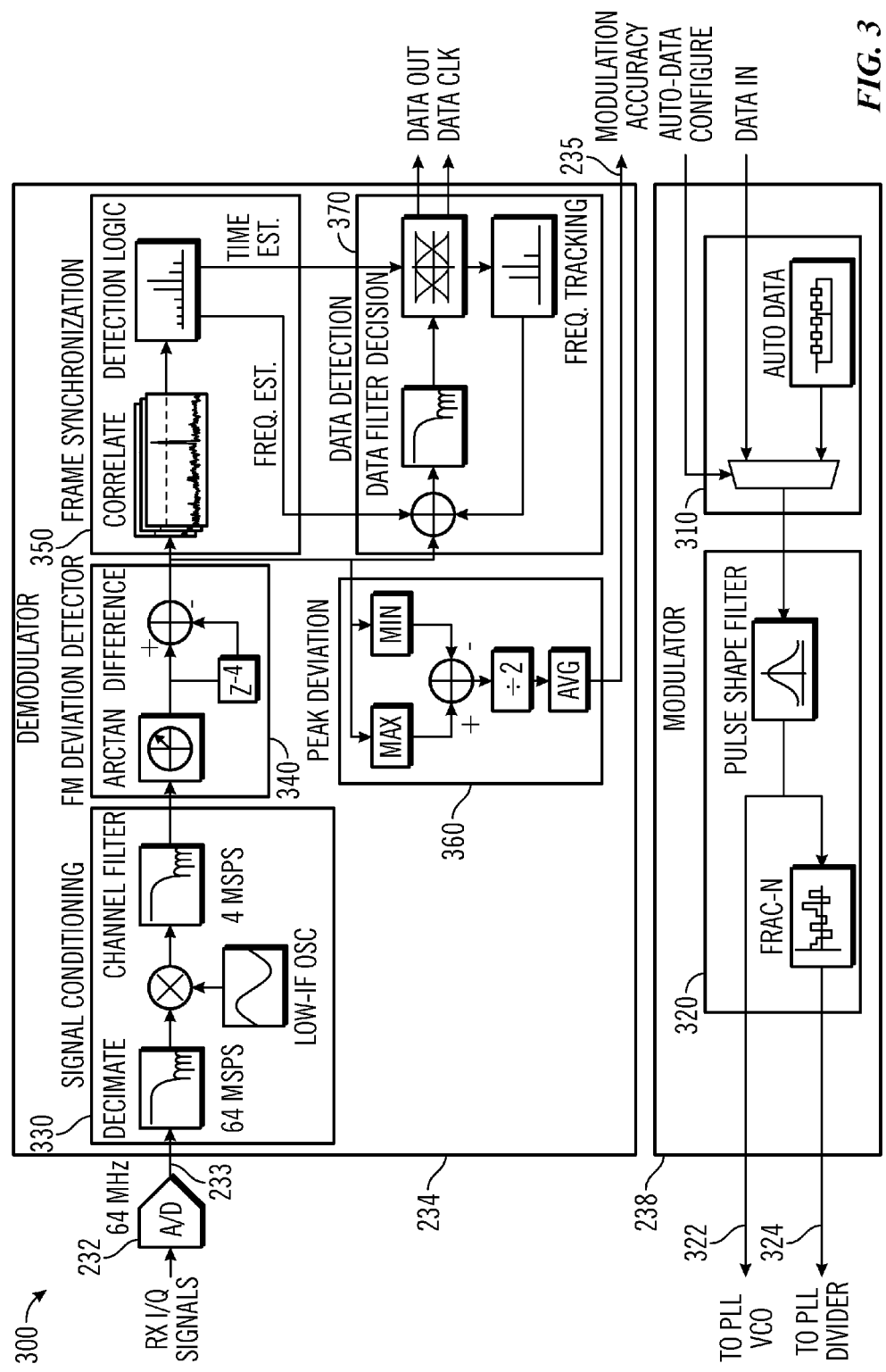
FIG. 3 is a high-level functional block diagram of an example modem, in accordance with various representative embodiments.

In certain example implementations, radio transceiver chip 220 may include an automatic data generation function that can produce one of several test data patterns (an example is an alternating pattern of 1 and 0 bits); this is shown as the "Auto Data" generation function 310 of modem 300 of FIG. 3. During the trim procedure, the test data pattern is used to frequency modulate signal 244 generated by the radio transceiver's dual-port PLL 242 while radio transceiver 220 receives un-modulated carrier signal 216 from the factory test (trim) station 210. The radio's demodulator 234 processes the modulated signal 244 generated by the transceiver PLL to determine modulation accuracy (such as, for example, peak frequency deviation). A software routine, executed by the radio transceiver's processor 236 monitors the measured modulation accuracy and makes adjustments to the analog gain value of the PLL via generated analog port trim signal 240 until acceptable modulation accuracy is achieved.

Referring now to FIG. 3, a high-level functional block diagram of an example modem 300 is shown. In certain embodiments, Modem 300 performs Gaussian Frequency Shift Keying (GFSK) demodulation and modulation in compliance with the Bluetooth LE 4.2 specification. However, any type of frequency modulation may make use of the trim procedures disclosed herein, including, for example, minimum shift keying (MSK), Gaussian-filtered MSK (GMSK), M-ary frequency shift keying (M-FSK), and offset quadrature phase shift keying (OQPSK), all variants of frequency modulation specified by IEEE 802.15.4 Standard for Wireless Personal Area Networks. Likewise, other types of modem or radio transceiver implementations and configurations may also make use of the trim test set up discussed herein and are within the scope of the present disclosure.

Demodulator 234 in this example includes a signal conditioning block 330 that performs sample rate reduction, channel filtering and frequency conversion from low IF to baseband. GFSK demodulation is performed with differential phase detection by FM deviation detector block 340. The recovered data waveform from Block 340 is passed to frame synchronization block 350 for correlation and packet detection and is also provided to data detection block 370 for payload recovery.

The recovered data waveform from FM deviation detector 340 is further provided to peak deviation block 360. As indicated, peak deviation block 360 produces the modulation accuracy signal 235 shown in FIG. 2. In this particular case, modulation accuracy is determined by peak deviation, computed as one-half of the peak-to-peak deviation, i.e. the maximum deviation less minimum deviation.

Block 310 of modulator 238 provides an optional "Auto Data" generation function of the transceiver modulator. An external configuration signal, shown as Auto-Data Configure, selects between the internally generated auto-data pattern generated by modulator block 310 and the normal data path provided by the model processor 236, shown as Data In. Pulse shape filter of block 320 of modulator 238 performs pulse shaping of the data received from the automatic data generation function 310 to generate a pulse-shaped automatically generated test data pattern; the pulse shape filter may be a Gaussian filter. A formatting function provides subsequent additional formatting of the shaped automatically generated test data pattern for dual-port PLL modulation. The VCO port of PLL 242 is provided signal 322 and re-quantized to match the number of discrete VCO modulation steps available. The divider port of PLL 242 is provided with signal 324 that encodes the divider port by a third-order signal delta to achieve modulated fractional-N division, or "Frac-N", as shown. Note that the modulator shown in FIG. 3 is a specific example implementation of modulator 238; other modulator embodiments may be used in the radio transceiver block diagram 200 of FIG. 2. and are within the scope of the present disclosure.

Some example trim tests that may be run on a transceiver DUT to test the transceiver's frequency response will now be described. Consider first an open loop test to test flatness of the transceiver's frequency response. With the PLL loop opened, a modulation digital-to-analog converter (DAC) 107 of the PLL VCO 106 is set to the lowest and highest settings and the frequency difference (delta) between settings is measured. The gain of the DAC is adjusted so the maximum frequency deviation, or delta, is a desired value; for example, the maximum frequency deviation in a Bluetooth LE environment may be +/−250 KHz or +/−500 KHz, depending on the mode of operation. In another test for flatness, a built-in modulation test pattern, such as one generated by the transceiver processor 236, is enabled while the transceiver is in a transmit (TX) mode. The VCO's modulation DAC 107 is adjusted until the max frequency deviation measured is obtained. Finally, consider a test for flatness in which a continuous wave (CW) tone is injected at the RF input to the transceiver 220. A built-in modulation test pattern, provided to modulator 238 by transceiver processor 236, and a deviation detector of demodulator 234 are used in this example to measure peak frequency deviation, the measurement of modulation accuracy. The VCO's modulation DAC 107 is adjusted until the maximum frequency deviation measured agrees with a desired value. The desired value of maximum frequency deviation for each of these trim tests may depend on various factors, including the test pattern itself.

Various test data patterns may be employed to frequency modulate the output signal 244 of PLL 242 to achieve a flat frequency response of the transceiver and are contemplated. Consider the following modulation flatness test patterns:

1. In an example embodiment, an alternating one-zero pattern is injected into PLL 242 at a frequency high enough to fall outside the loop bandwidth so that the tone falls in the VCO high port side of the PLL. Referring again to the example embodiment of FIG. 3, peak deviation block 360 of demodulator 234 measures peak deviation of the signal, thereby allowing radio processor 236 to adjust the VCO high port modulation gain using analog port trim signal 240 until the desired modulation accuracy level is achieved.

2. In a further example, PLL 242 is modulated with a tone at low enough frequency such that it falls inside the loop bandwidth of PLL 242. Demodulator 236 is used to measure the peak deviation, by peak deviation block 360, for example, and record the measured value (Fdev1). The frequency of the tone is then increased such that it falls outside the loop bandwidth of the PLL and demodulator 236 measures peak deviation (Fdev2). The VCO high port modulation gain of the PLL is increased until the difference between the first measured value (Fdev1) and the second measured value (Fdev2) is approximately zero.

3. In another example, PLL 242 is modulated with two simultaneous tones of different frequencies such that one tone falls inside the loop bandwidth and the other falls outside the loop bandwidth. Peak deviation block 360 of demodulator 234, for instance, measures average and peak deviation of these signals.

4. PLL 242 is modulated with a random waveform, such as a random Bluetooth low energy (BLE) Gaussian shaped waveform, and the modulation accuracy of the waveform is measured with external test equipment (i.e. computer-based testing (CBT)). The VCO high port modulation gain of PLL 242 is adjusted via analog port trim signal 240 from radio processor 236 until the measured modulation accuracy is within limits.

Figure 4:
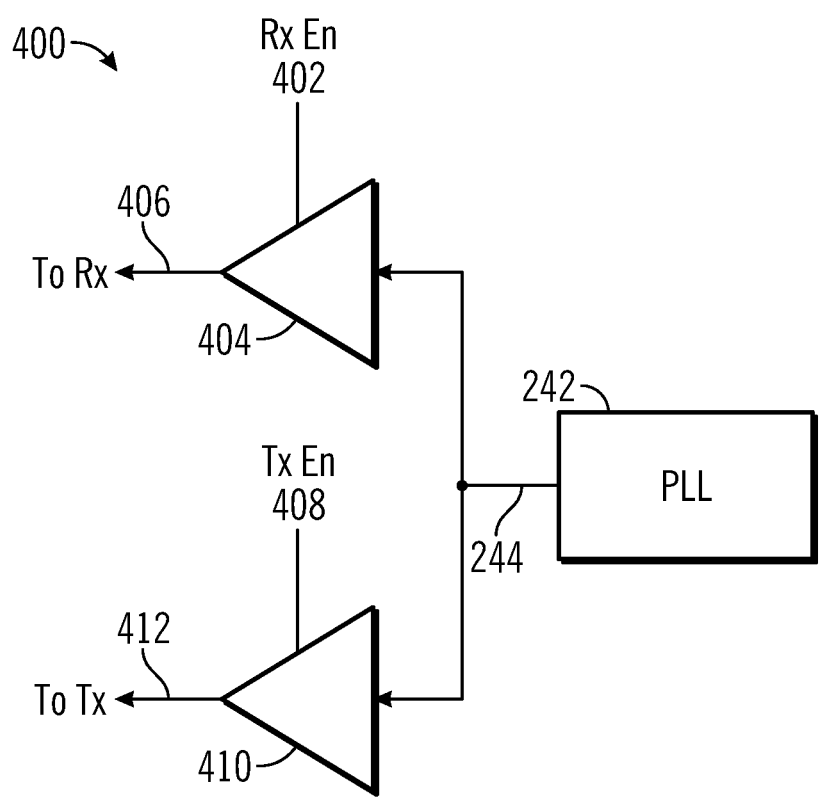
FIG. 4 illustrates switching circuitry, in accordance with various representative embodiments.

As the PLL is used by the radio transceiver for both transmission and reception, the output of PLL 242 needs to be switched between receive and transmit functions of the transceiver. This functionality may be provided by divider circuitry or switched buffer stages. Other arrangements for switching PLL output 244 between transmit and receive functions of the transceiver are contemplated. As an example, consider where PLL 242 operates at twice the desired output frequency. In this case, two divide-by-two circuits arranged in parallel—one having an output signal going to the transmitter and the other having an output signal going to the receiver—may be used. Switching may be accomplished through selective enabling and disabling of the divider circuits. Such an arrangement is illustrated in diagram 400 of FIG. 4 in which the output signal 244 of PLL 242 is provided to divide-by-two circuits 404 and 410, which are controlled by receive enable signal 402 and transmit enable signal 408, respectively. Switching is accomplished by enabling the desired divider circuit 404 or 410 and disabling the other divider circuit. The dividers provide buffering as well as frequency division of signal 244.

Figure 5:
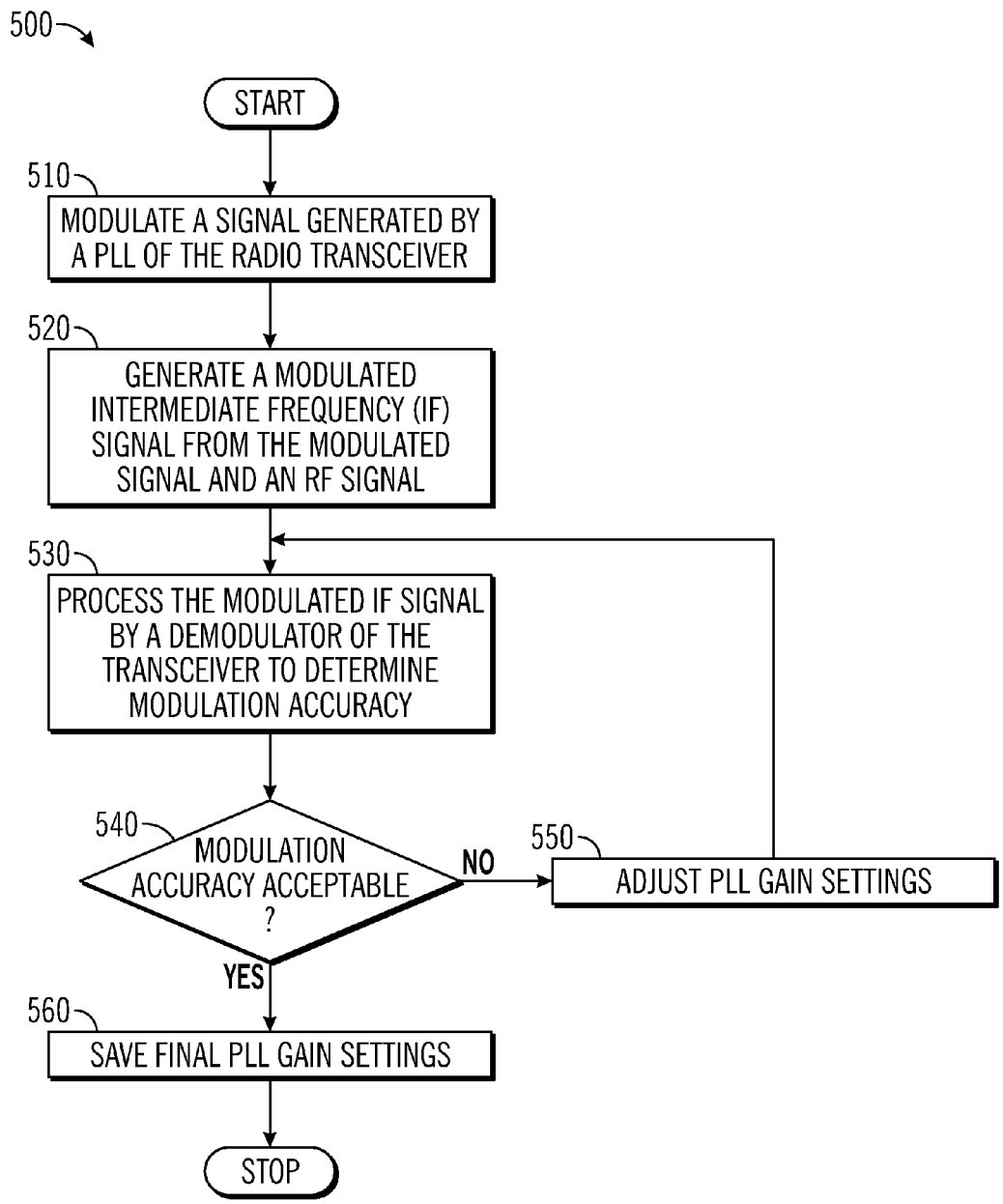
FIG. 5 is a flowchart that illustrates trimming analog gain of a radio transceiver, in accordance with various representative embodiments.
Figure 6:
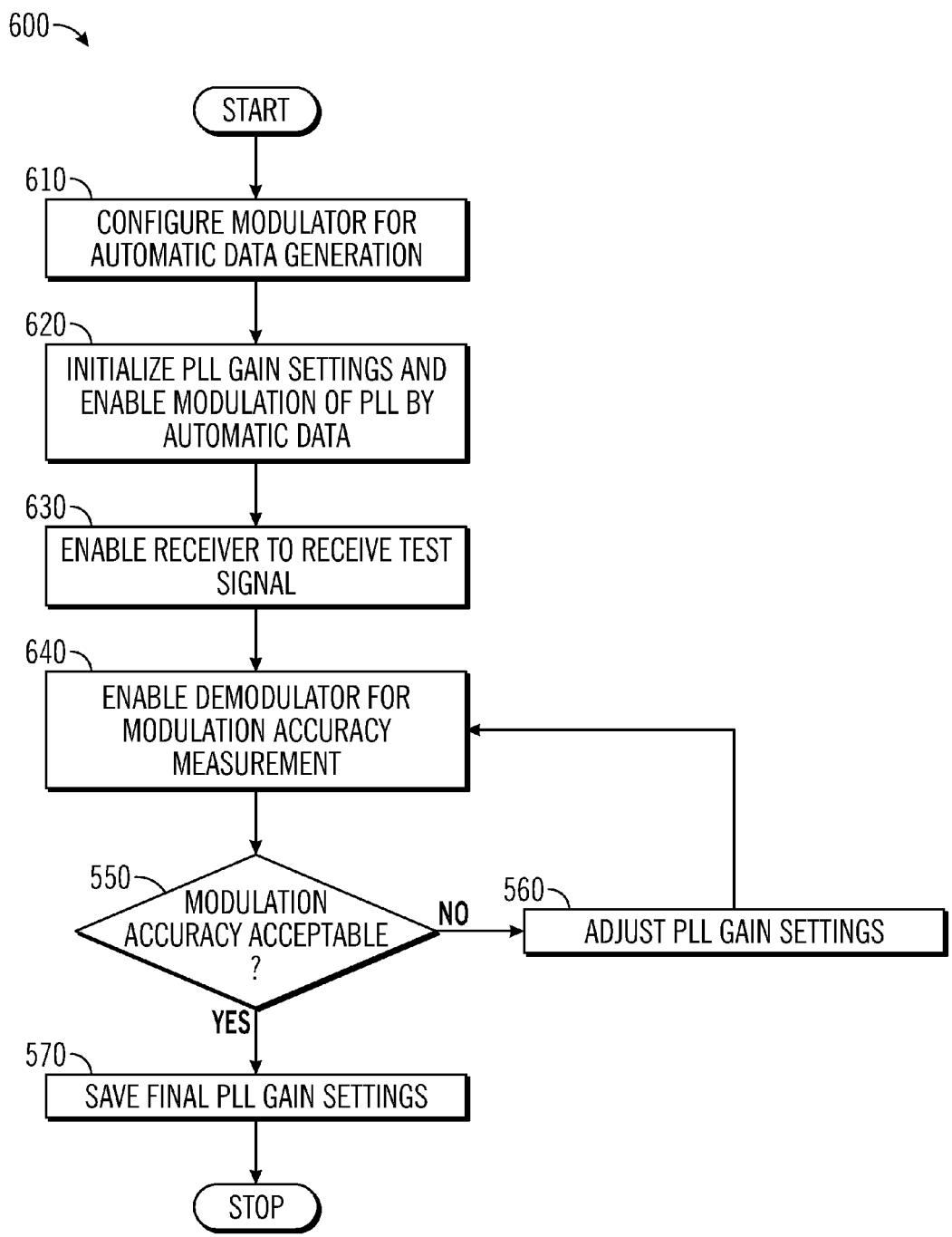
FIG. 6 is a flowchart that illustrates a methodology for gain adjustment using automatic data generation, in accordance with various representative embodiments.

Trimming the gain in a dual-port phase-locked loop (PLL) of a radio transceiver using the radio's demodulator to perform modulation accuracy measurements and then selectively adjusting the transceiver analog gain value has been discussed. Referring now to the flows of FIGS. 5 and 6, methodologies that may be employed to perform transceiver analog trim are shown. These methods may be performed by the radio transceiver processor, either directly or with the assistance of hardware state machines. Referring now to FIG. 5, flowchart 500 illustrates a methodology for trimming analog gain of a radio transceiver in accordance with certain embodiments of the disclosure. At Block 510, a signal generated by the PLL of the radio transceiver is modulated to generate a modulated signal; this is shown as signal 244 generated by the radio transceiver's dual-port PLL 242, for example. As has been previously described, signal 244 is modulated by modulator 238 in accordance with a test data pattern; this test data pattern may be provided by either the transceiver processor 236 or it may be generated by an Auto Data function of the modulator, as discussed above in connection with FIG. 3. This modulation occurs while transceiver 220 receives un-modulated carrier 216 from the test station signal generator 212. At Block 520, the transceiver generates a modulated intermediate frequency signal 233 from an RF signal 216 and the modulated signal 244 generated at Block 510. The RF signal 216 may be derived from an un-modulated carrier received by the transceiver, such as signal 216 shown in FIG. 2. At Block 530, the modulated IF signal 233 is processed by a demodulator 234 of the transceiver to determine modulation accuracy of the modulated intermediate frequency signal; the modulation accuracy of the modulated IF signal is given by modulation accuracy signal 235.

Next, the determined modulation accuracy 235 of the modulated IF signal 233 is monitored. Responsive to the modulation accuracy falling outside an acceptable range of modulation accuracy, the analog gain value of the transceiver is adjusted to bring the modulation accuracy of the modulated intermediate frequency signal within the acceptable range of modulation accuracy. At Decision Block 540, then, the modulation accuracy measurement obtained by the radio transceiver demodulator at Block 530, i.e. modulation accuracy signal 235, is analyzed by radio processor 236. If the measured modulation accuracy is not acceptable, then the PLL gain settings are adjusted at Block 560; the PLL gain is adjusted by analog port trim signal 240 provided to PLL 242, for example. If the measured modulation accuracy is acceptable, the flow simply continues to Block 560 where the final PLL gain settings may be saved. Gain settings can be stored so that a saved "trim value" may be readily retrieved and loaded into the VCO as needed. As an example, gain settings may be stored in non-volatile memory, such as FLASH memory that may reside in the transceiver processor itself or in another location that is accessible to the transceiver processor. The stored trim value may then be retrieved from FLASH memory and loaded into the VCO before each transmission.

As has been disclosed, automatic data generation may be employed in certain embodiments when trimming the gain in a dual-port phase-locked loop (PLL) of a radio transceiver. Referring to flowchart 600 of FIG. 6, a methodology for gain adjustment using automatic data generation by the transceiver modulator is illustrated. At Block 610, the modulator is configured for automatic data generation. As previously described, radio transceiver chip 220 may include an automatic data generation function capable of producing test data patterns; this is shown as the "Auto Data" generation function 310 of modem 300 shown in FIG. 3. An external configuration signal, such as Auto-Data Configure of FIG. 3, selects between the internally generated auto-data pattern generated by modulator block 310 and the normal data path provided by the model processor 236, shown as Data In. In this instance, the Auto-Data Configure signal is used to cause Auto Data function of Block 310 to automatically generate test data; this Auto Data is used to modulate PLL 242 rather than the data generated by processor 236.

During the trim procedure, the test data pattern is used to frequency modulate the signal 244 generated by the radio transceiver's dual-port PLL 242 while the radio transceiver 220 receives an un-modulated carrier signal 216 from the factory test (trim) station 210. PLL gain settings of the radio transceiver 220 are initialized and frequency modulation of the PLL by automatic data is enabled at Block 620. At Block 630, the receiver of the radio DUT is enabled to receive a test data pattern signal, in this case, the automatic data generated by auto data function 310. The transceiver demodulator is enabled for modulation accuracy measurement at Block 640. As previously discussed, modulation accuracy signal 235 produced by demodulator 234 is representative of the modulation accuracy measurement taken by the transceiver demodulator function. At Decision Block 650 the modulation accuracy measurement obtained by the demodulator at Block 640 is analyzed by radio processor 236. If the measured modulation accuracy is not within an acceptable range of modulation accuracy, then the PLL gain settings are adjusted at Block 660. If the measured modulation accuracy is acceptable, then the final PLL gain settings may be saved at Block 670.

Initialization of PLL gain settings and enabling of transceiver modulation and demodulation functions discussed in connection with flow 600 may be accomplished by the transceiver processor writing values to control registers of target circuitry as needed. Consider, for example, that the Auto Data portion of modulator block 310 may include a control register whose bits control turning on the auto data function and selection of the pattern to be used. Similarly, with regard to VCO circuitry 106, control register bits of the VCO allow it to be turned on or off and for various operating modes and parameters to be selected (enabled); such control register bits are used to control the modulation gain settings of the VCO, for example.

Figure 7:
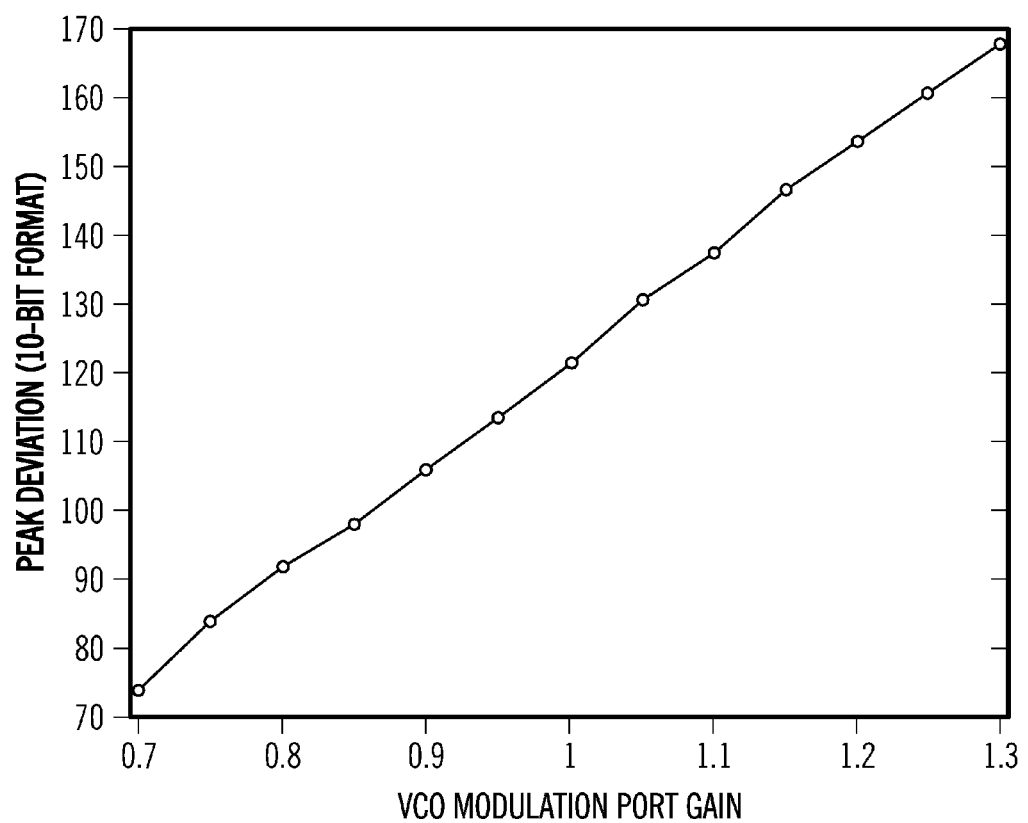
FIG. 7 is a plot that illustrates modulation accuracy version analog port gain, in accordance with various representative embodiments.

An example of peak frequency deviation, measured by the radio transceiver's FM demodulator, versus analog port gain is shown in FIG. 7, which illustrates modulation accuracy (peak frequency deviation) version analog port gain. This example plot represents a Bluetooth Low Energy 1 Mbps mode with a test data pattern of alternating 1 and 0 bits used to frequency modulate the signal generated by the transceiver's PLL. When the analog gain is at its ideal value, represented as 1.0, the peak deviation is 122. The software trim algorithm of the transceiver processor will adjust the analog gain, if needed, until the peak frequency deviation is within predefined limits of its ideal value of 122, the acceptable range of modulation accuracy in this example.

Due to fabrication process variations in the radio transceiver, the ideal analog gain value is not known in advance. Nonetheless, the disclosed embodiments illustrate that the PLL analog gain can be readily adjusted until the measured modulation accuracy is within an acceptable range. Examples of process variations may include, for example, via resistance, threshold voltage, mobility, process lithographic width and length variations, dopant distribution, line edge roughness, etc. Effects of process variations may include hot carrier degradation and bias temperature stress (BTS), for example.

Those skilled in the art will recognize that the present disclosure has been described in terms of example embodiments based upon use of a programmed processor. However, the invention should not be so limited, since the present disclosure could be implemented using hardware component equivalents such as special purpose hardware and/or dedicated processors which are equivalents to the disclosure as described and claimed. Similarly, general purpose computers, microprocessor based computers, micro-controllers, optical computers, analog computers, dedicated processors and/or dedicated hard wired logic may be used to construct alternative equivalent embodiments of the present disclosure.

Moreover, those skilled in the art will appreciate that a program flow and associated data used to implement the embodiments described above can be implemented using various forms of storage such as Read Only Memory (ROM), Random Access Memory (RAM), Electrically Erasable Programmable Read Only Memory (EEPROM); non-volatile memory (NVM); mass storage such as a hard disc drive, floppy disc drive, optical disc drive; optical storage elements, magnetic storage elements, magneto-optical storage elements, flash memory, core memory and/or other equivalent storage technologies without departing from the present disclosure. Such alternative storage devices should be considered equivalents.

Various embodiments described herein are implemented using programmed processors executing programming instructions that are broadly described in flow chart form that can be stored on any suitable electronic storage medium or transmitted over any suitable electronic communication medium. However, those skilled in the art will appreciate that the processes described above can be implemented in any number of variations and in many suitable programming languages without departing from the present disclosure. For example, the order of certain operations carried out can often be varied, additional operations can be added or operations can be deleted without departing from the disclosure. Error trapping can be added and/or enhanced and variations can be made in user interface and information presentation without departing from the present disclosure. Such variations are contemplated and considered equivalent.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

Accordingly, some aspects and features of the disclosed embodiments are set out in the following numbered items:

1. A method for trimming analog gain of a transceiver of a radio, comprising: modulating a signal generated by a phase-locked loop of the transceiver to generate a modulated signal; generating by the transceiver a modulated intermediate frequency signal from a radio frequency (RF) signal and the modulated signal; processing the modulated intermediate frequency signal by a demodulator of the transceiver to determine modulation accuracy of the modulated intermediate frequency signal; and monitoring the determined modulation accuracy of the modulated intermediate frequency signal and responsive to the determined modulation accuracy falling outside an acceptable range of modulation accuracy, adjusting the analog gain value of the transceiver to bring the modulation accuracy of the modulated intermediate frequency signal within the acceptable range of modulation accuracy.

2. The method of item 1, further comprising modulating the signal generated by the phase-locked loop in accordance with a test data pattern.

3. The method of item 2, further comprising receiving the test data pattern at a dual-port frequency modulation (FM) modulator of the transceiver.

4. The method of item 3, where the test data pattern received by the dual-port FM modulator is generated by a test generation function of a processor of the transceiver.

5. The method of item 2, where the test data pattern is automatically generated by a processor of the transceiver.

6. The method of item 5, where the test data pattern is automatically generated by an automatic data generation function of the dual-port frequency modulation (FM) modulator of the transceiver.

7. The method of item 6, further comprising: responsive to the dual-port FM modulator receiving a data configure signal to select the test data pattern automatically generated by the automatic data generation function and to not select a data pattern provided to the dual-port FM modulator, the automatic data generation function providing to a pulse shape filter of the dual-port FM modulator the automatically generated test data pattern; the pulse shape filter shaping the received automatically generated test data pattern; and providing the pulse-shaped automatically generated test data pattern to the phase-locked loop.

8. The method of item 7, further comprising: a formatting function of the dual-port FM modulator receiving and formatting the pulse-shaped automatically generated test data pattern to generate a formatted, pulse-shaped automatically generated test data pattern; and providing the formatted, pulse-shaped automatically generated test data pattern to the phase-locked loop.

9. The method of item 2, where the test data pattern is an alternating one-zero pattern and the method further comprising: providing the alternating one-zero test data pattern to the phase-locked loop at a frequency sufficient to fall outside a bandwidth of the phase-locked loop; modulating the signal generated by the phase-locked loop; generating the modulated intermediate frequency signal from the RF and the modulated signal; processing the modulated intermediate frequency signal by the demodulator to determine peak deviation of the modulated intermediate frequency signal; and adjusting a voltage-controlled oscillator modulation gain of the phase-locked loop in accordance with an analog port trim signal generated by a processor of the transceiver, the analog port trim signal generated responsive to the determined peak deviation of the modulated intermediate frequency signal and sufficient to adjust the peak deviation of the modulated intermediate frequency signal to within an acceptable range of peak deviation.

10. The method of item 1, further comprising mixing by a mixer of the transceiver the modulated signal and the RF signal to generate the modulated IF signal.

11. The method of item 1, where the RF signal is derived from an un-modulated carrier received by the transceiver.

12. The method of item 1, where processing the modulated intermediate frequency signal by the demodulator of the transceiver to determine the modulation accuracy comprises determining peak frequency deviation of the modulated intermediate frequency signal.

13. The method of item 1, further comprising: receiving at a radio frequency (RF) input of the transceiver an un-modulated carrier and producing from the un-modulated carrier the RF signal; mixing the RF signal and the modulated signal to produce a modulated analog signal; and processing the modulated analog signal to generate the modulated intermediate frequency signal.

14. The method of item 13, where a mixer of the transceiver performs mixing the RF signal and the modulated signal to produce the modulated analog signal.

15. The method of claim 13, where processing the modulated analog signal further comprises: amplifying and filtering the modulated analog signal to generate an amplified, filtered analog signal; and converting the amplified, filtered analog signal from analog to digital to generate the modulated intermediate frequency signal.

16. The method of item 15, further comprising mixing by a mixer of the transceiver the modulated signal and the radio frequency (RF) signal to generate the modulated intermediate frequency (IF) signal.

17. The method of item 15, where processing the modulated intermediate frequency signal by the demodulator of the transceiver to determine the modulation accuracy comprises determining peak frequency deviation of the modulated intermediate frequency signal.

18. The method of item 15, where a mixer of the transceiver performs mixing the radio frequency (RF) signal and the modulated signal to produce the modulated analog signal.

19. The method of item 15, further comprising: saving the adjusted analog gain value of the transceiver.

20. The method of item 1, further comprising: saving the adjusted analog gain value of the transceiver.

21. The method of item 1, where the test data pattern is automatically generated by an automatic data generation function or a processor of a dual-port frequency modulation (FM) modulator of the transceiver.

What is claimed is:

1. A method for trimming analog gain of a transceiver of a radio, comprising:
   receiving at a radio frequency (RF) input of the transceiver an un-modulated carrier and producing from the un-modulated carrier an RF signal;
   modulating a signal generated by a phase-locked loop of the transceiver to generate a modulated signal;
   generating by the transceiver a modulated intermediate frequency signal from the RF signal and the modulated signal by:
      mixing the RF signal and the modulated signal to produce a modulated analog signal; and
      processing the modulated analog signal to generate the modulated intermediate frequency signal, further comprising:
         amplifying and filtering the modulated analog signal to generate an amplified, filtered analog signal; and
         converting the amplified, filtered analog signal from analog to digital to generate the modulated intermediate frequency signal;
   processing the modulated intermediate frequency signal by a demodulator of the transceiver to determine modulation accuracy of the modulated intermediate frequency signal; and
   monitoring the determined modulation accuracy of the modulated intermediate frequency signal and responsive to the determined modulation accuracy falling outside an acceptable range of modulation accuracy, adjusting the analog gain value of the transceiver to bring the modulation accuracy of the modulated intermediate frequency signal within the acceptable range of modulation accuracy.

2. The method of claim 1, further comprising modulating the signal generated by the phase-locked loop in accordance with a test data pattern.

3. The method of claim 2, further comprising receiving the test data pattern at a dual-port frequency modulation (FM) modulator of the transceiver.

4. The method of claim 3, where the test data pattern received by the dual-port FM modulator is generated by a test generation function of a processor of the transceiver.

5. The method of claim 2, where the test data pattern is automatically generated by a processor of the transceiver.

6. The method of claim 5, where the test data pattern is automatically generated by an automatic data generation function of the dual-port frequency modulation (FM) modulator of the transceiver.

7. A method for trimming analog gain of a transceiver of a radio, comprising:
   modulating in accordance with a test data pattern a signal generated by a phase-locked loop of the transceiver to generate a modulated signal, where the test data pattern is automatically generated by an automatic data generation function of the dual-port frequency modulation (FM) modulator of the transceiver;
   generating by the transceiver a modulated intermediate frequency signal from a radio frequency (RF) signal and the modulated signal;
   processing the modulated intermediate frequency signal by a demodulator of the transceiver to determine modulation accuracy of the modulated intermediate frequency signal;
   monitoring the determined modulation accuracy of the modulated intermediate frequency signal and responsive to the determined modulation accuracy falling outside an acceptable range of modulation accuracy, adjusting the analog gain value of the transceiver to bring the modulation accuracy of the modulated intermediate frequency signal within the acceptable range of modulation accuracy;
   responsive to the dual-port FM modulator receiving a data configure signal to select the test data pattern automatically generated by the automatic data generation function and to not select a data pattern provided to the dual-port FM modulator, the automatic data generation function providing to a pulse shape filter of the dual-port FM modulator the automatically generated test data pattern;
   the pulse shape filter shaping the received automatically generated test data pattern; and
   providing the pulse-shaped automatically generated test data pattern to the phase-locked loop.

8. The method of claim 7, further comprising:
   a formatting function of the dual-port FM modulator receiving and formatting the pulse-shaped automatically generated test data pattern to generate a formatted, pulse-shaped automatically generated test data pattern; and
   providing the formatted, pulse-shaped automatically generated test data pattern to the phase-locked loop.

9. The method of claim 2, where the test data pattern is an alternating one-zero pattern and the method further comprising:
   providing the alternating one-zero test data pattern to the phase-locked loop at a frequency sufficient to fall outside a bandwidth of the phase-locked loop;

modulating the signal generated by the phase-locked loop;

generating the modulated intermediate frequency signal from the RF and the modulated signal;

processing the modulated intermediate frequency signal by the demodulator to determine peak deviation of the modulated intermediate frequency signal; and adjusting a voltage-controlled oscillator modulation gain of the phase-locked loop in accordance with an analog port trim signal generated by a processor of the transceiver, the analog port trim signal generated responsive to the determined peak deviation of the modulated intermediate frequency signal and sufficient to adjust the peak deviation of the modulated intermediate frequency signal to within an acceptable range of peak deviation.

10. The method of claim 1, further comprising mixing by a mixer of the transceiver the modulated signal and the RF signal to generate the modulated IF signal.

11. The method of claim 1, where the RF signal is derived from an un-modulated carrier received by the transceiver.

12. The method of claim 1, where processing the modulated intermediate frequency signal by the demodulator of the transceiver to determine the modulation accuracy comprises determining peak frequency deviation of the modulated intermediate frequency signal.

13. The method of claim 1, where a mixer of the transceiver performs mixing the radio frequency (RF) signal and the modulated signal to produce the modulated analog signal.

14. The method of claim 1, further comprising:
saving the adjusted analog gain value of the transceiver.

15. The method of claim 1, further comprising:
saving the adjusted analog gain value of the transceiver.

16. The method of claim 1, where the test data pattern is automatically generated by an automatic data generation function or a processor of a dual-port frequency modulation (FM) modulator of the transceiver.

* * * * *